United States Patent
Lee et al.

(10) Patent No.: US 9,626,901 B2
(45) Date of Patent: Apr. 18, 2017

(54) DISPLAY DEVICE

(71) Applicant: LG Display Co., Ltd., Seoul (KR)

(72) Inventors: Soyoung Lee, Seoul (KR); Youngjik Jo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 200 days.

(21) Appl. No.: 14/501,872

(22) Filed: Sep. 30, 2014

(65) Prior Publication Data

US 2015/0092128 A1 Apr. 2, 2015

(30) Foreign Application Priority Data

Oct. 1, 2013 (KR) .................. 10-2013-0117374

(51) Int. Cl.
| | | |
|---|---|---|
| *G02F 1/13* | (2006.01) | |
| *G09G 3/3225* | (2016.01) | |
| *G02F 1/1362* | (2006.01) | |
| *H01L 27/02* | (2006.01) | |
| *G02F 1/1345* | (2006.01) | |
| *H01L 27/32* | (2006.01) | |

(52) U.S. Cl.
CPC ....... *G09G 3/3225* (2013.01); *G02F 1/13452* (2013.01); *G02F 1/136204* (2013.01); *G02F 1/136259* (2013.01); *G02F 1/136286* (2013.01); *H01L 27/0296* (2013.01); *H01L 27/3276* (2013.01)

(58) Field of Classification Search
CPC ......... G02F 1/136204; G02F 1/134336; G02F 1/136259
See application file for complete search history.

(56) References Cited

U.S. PATENT DOCUMENTS

| | | | |
|---|---|---|---|
| 2011/0157127 A1 | 6/2011 | Jun | |
| 2014/0184670 A1* | 7/2014 | Jeong ................. | G09G 3/2003 345/694 |

FOREIGN PATENT DOCUMENTS

| | | |
|---|---|---|
| CN | 1363921 A | 8/2002 |
| CN | 101000753 A | 7/2007 |
| CN | 101089685 A | 12/2007 |
| CN | 102122597 A | 7/2011 |
| CN | 103208250 A | 7/2013 |
| KR | 20120048283 | * 10/2012 |

* cited by examiner

*Primary Examiner* — Phu Vu
(74) *Attorney, Agent, or Firm* — Dentons US LLP

(57) ABSTRACT

Discloses is a display device that may include a display panel; sub-pixels in a display area of the display panel; upper and lower data lines separated in a central portion of the display area; and an electrostatic discharge circuit formed in the central portion of the display area, the electrostatic discharge circuit electrically connected to the upper and lower data lines.

9 Claims, 16 Drawing Sheets

DISPLAY DEVICE

This application claims the benefit of Korean Patent Application No. 10-2013-0117374 filed on Oct. 1, 2013, which is incorporated by reference for all purposes as if fully set forth herein.

BACKGROUND OF THE INVENTION

Field of the Invention

This document relates to a display device and method for manufacturing the same, and more particular, to a display device and method for manufacturing the same that is less sensitive to static electricity with an electrostatic discharge (ESD) circuit.

Discussion of the Related Art

With the development of information technology, the display market for media connecting users and information is growing. In line with this trend, the use of display devices, such as an organic light emitting display (OLED), a liquid crystal display (LCD) device, and a plasma display panel (PDP), is increasing.

A display device typically includes a display panel including a plurality of sub-pixels arranged in a matrix form, a driver for driving the display panel, and a timing controller for controlling the driver. The driver includes a gate driver for supplying a gate signal to the display panel and a data driver for supplying a data signal to the display panel.

Some of the aforementioned display devices are implemented as high-resolution models. For the high-resolution models, there has been proposed a structure in which data lines are vertically separated in a central portion of the display panel, in order to secure sufficient charging time for a data signal to be supplied to the sub-pixels.

This structure is called a "data line output floating" structure, which allows the ends of data lines to electrically float as the data lines are vertically separated in the central portion of the display panel. However, the proposed structure may not discharge the display panel efficiently at the ends of the data lines and be vulnerable to static electricity, which need to be addressed.

SUMMARY OF THE INVENTION

Accordingly, the present invention is directed to a display device and method for manufacturing the same that substantially obviates one or more of the problems due to limitations and disadvantages of the related art.

An advantage of the present invention is to provide a display device and method for manufacturing the same that is less sensitive to static electricity by inserting an ESD circuit in a central portion of the display panel with a vertically separated structure.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a display panel; sub-pixels in a display area of the display panel; upper and lower data lines separated in a central portion of the display area; and an electrostatic discharge circuit formed in the central portion of the display area, the electrostatic discharge circuit electrically connected to the upper and lower data lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the present invention, examples of which are illustrated in the accompanying drawings.

First Exemplary Embodiment

Figure 1:
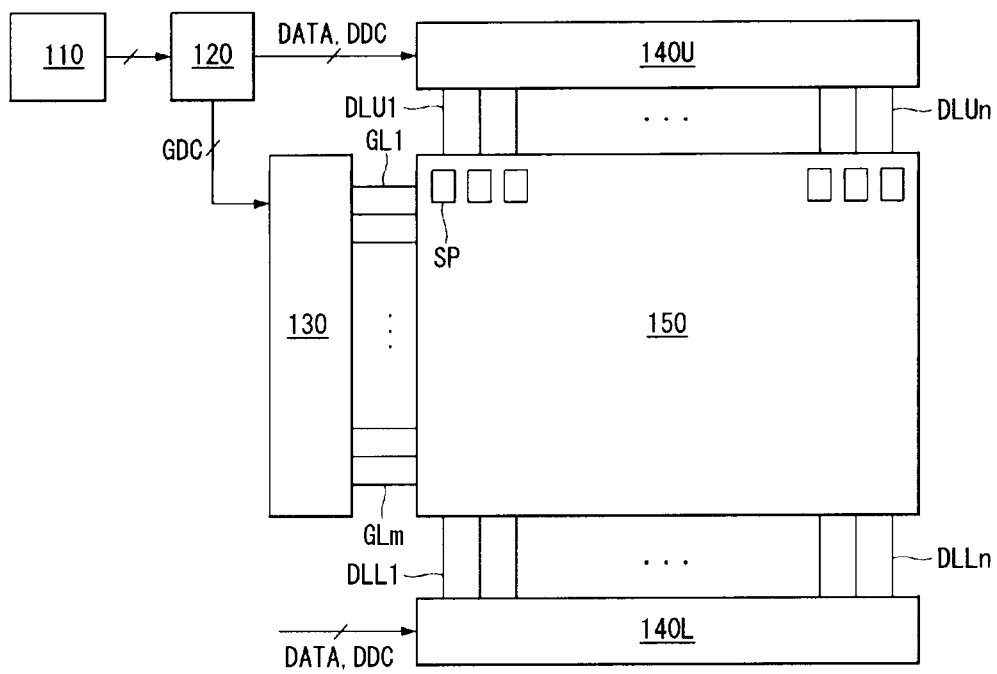
FIG. 1 is a block diagram schematically illustrating a display device.
Figure 2:
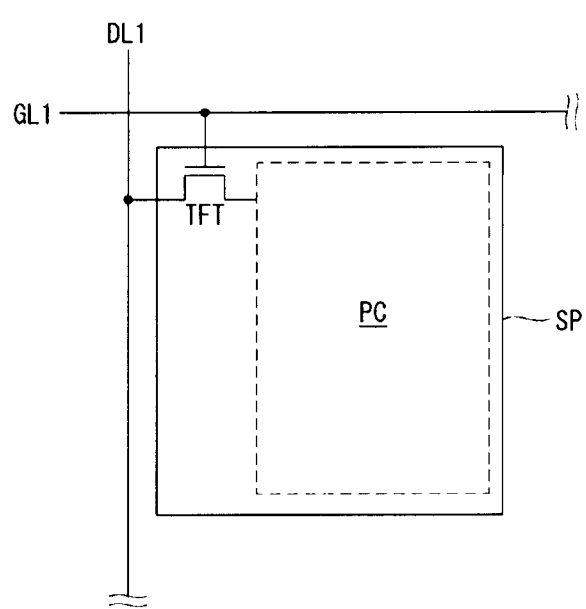
FIG. 2 is a configuration diagram schematically illustrating a sub-pixel of FIG. 1.

FIG. 1 is a block diagram schematically illustrating a display device. FIG. 2 is a configuration diagram schematically illustrating a sub-pixel of FIG. 1;

As illustrated in FIG. 1, the display device includes an image supply part 110, a timing controller 120, a gate driver 130, a data driver 140U and 140L, and a display panel 150.

The image supply part 110 supplies a vertical synchronization signal Vsync, a horizontal synchronization signal Hsync, a data enable signal DE, a clock signal CLK, and a data signal DATA to the timing controller 120. The image supply part 110 is in the form of an integrated circuit (IC), and mounted on a circuit substrate such as a system board or main board.

In response to a variety of signals supplied to the image supply part 110, the timing controller 120 outputs a gate timing control signal GDC for controlling the operation timing of the gate driver 130 and a data timing control signal DDC for controlling the operation timing of the data driver 140U and 140L. The timing controller 120 supplies a data signal DATA, along with the data timing control signal DDC, to the data driver 140U and 140L.

The gate driver 130 outputs a gate signal while shifting the level of a gate voltage in response to the gate timing control signal GDC supplied from the timing controller 120. The gate driver 130 supplies the gate signal to the sub-pixels SP included in the display panel 150 via gate lines GL1 to GLm. The gate driver 30 is in the form of an integrated circuit and mounted on a flexible circuit board, or may be formed in a non-display area of the display panel 150 in a Gate-In-Panel (GIP) manner.

The data driver 140U and 140L samples and latches the data signal DATA in response to the data timing control signal DDC supplied form the timing controller 120. The data driver 140U and 140L converts the latched data signal DATA into a gamma reference voltage and outputs the gamma reference voltage. The data driver 140U and 140L includes an upper data driver 140U for outputting a data signal in an upper part of the display panel 150 and a lower data driver 140L for outputting a data signal in a lower part of the display panel 150. The upper and lower data drivers 140U and 140L supply the data signal DATA to the sub-pixels SP included in the display panel 150 via upper and lower data lines DLU1 to DLUn and DLL1 to DLLn that separated into upper and lower parts of the display panel 150. The data driver 140 is in the form of an integrated circuit and mounted on a flexible circuit board or the like.

The display panel 150 display an image in response to the gate signal supplied from the gate driver 130 and the data signal DATA supplied from the data driver 140U and 140L. The display panel 150 includes sub-pixels SP that are positioned between a lower substrate and an upper substrate and emit or control light to display an image.

As illustrated in FIG. 2, a single sub-pixel includes a thin film transistor TFT connected to the gate line GL1 and the data line DL1 and a pixel circuit PC driven in response to the data signal DATA supplied through the thin film transistor. The display panel may be a liquid crystal display panel including a liquid crystal element or an organic light emitting display panel including an organic light emitting element.

When the display panel 150 is the liquid crystal display panel, it can be implemented in a twisted nematic (TN) mode, a vertical alignment (VA) mode, an in-plane switching (IPS) mode, a fringe field switching (FFS) mode, or an electrically controlled birefringence (ECB) mode. When the display panel 150 is the organic light emitting display panel, it can be implemented in a top emission type, a bottom emission type, or a dual emission type.

Hereinafter, the first exemplary embodiment of the present invention will be described in detail. In this embodiment, a liquid crystal display panel is used as the display panel 150 by way of example.

Figure 3:
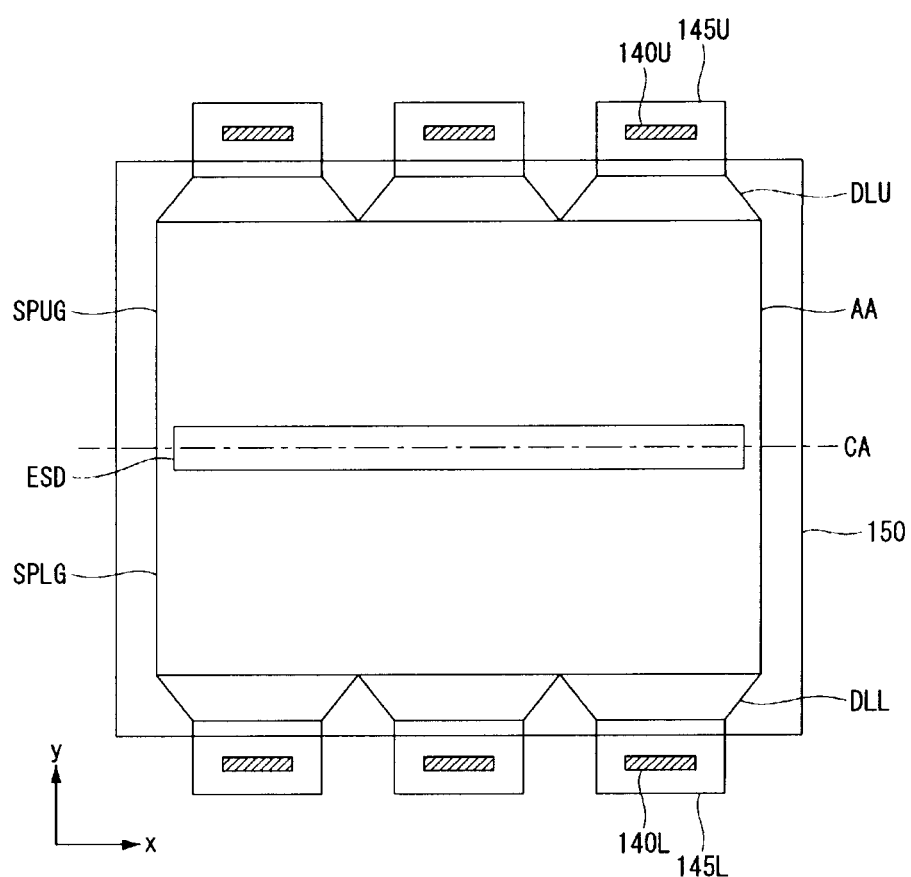
FIG. 3 is a top plan view illustrating a configuration of a display panel according to a first exemplary embodiment of the present invention.
Figure 4:
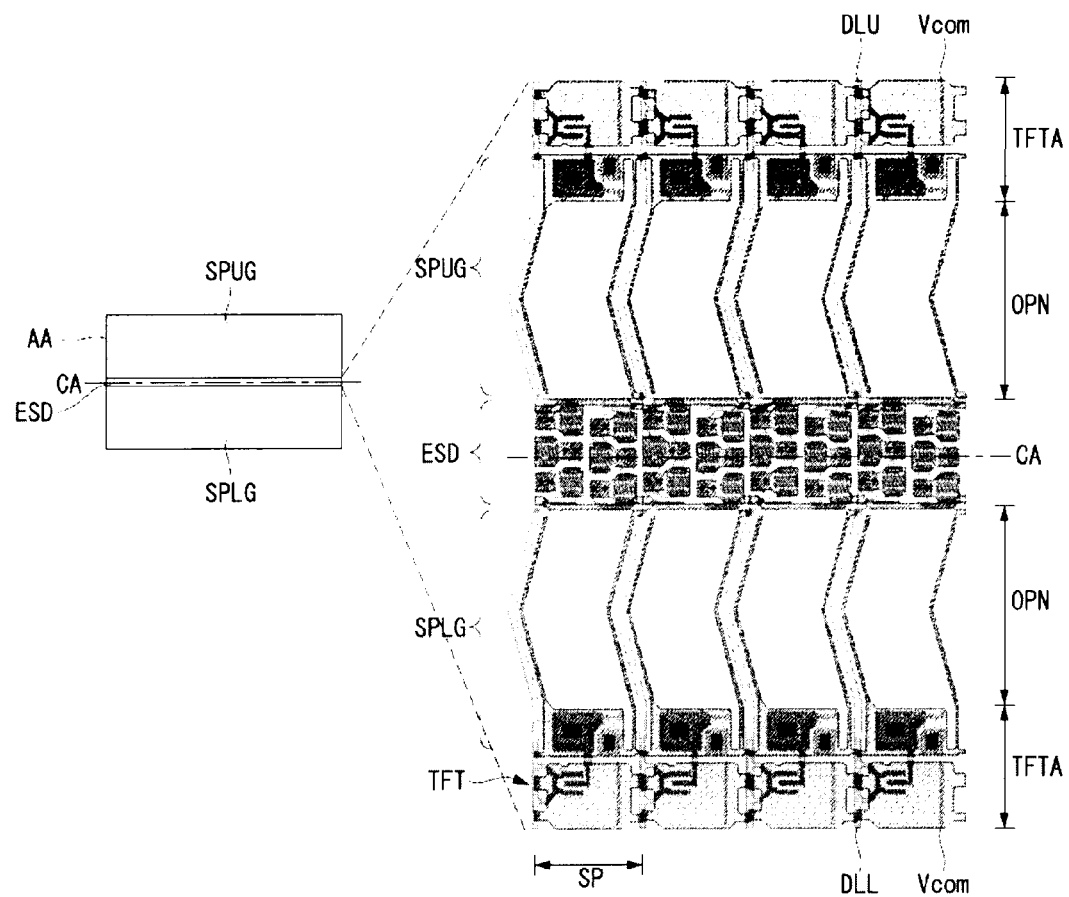
FIG. 4 is an enlarged view of the central portion illustrated in FIG. 3 according to the first exemplary embodiment of the present invention.
Figure 5:
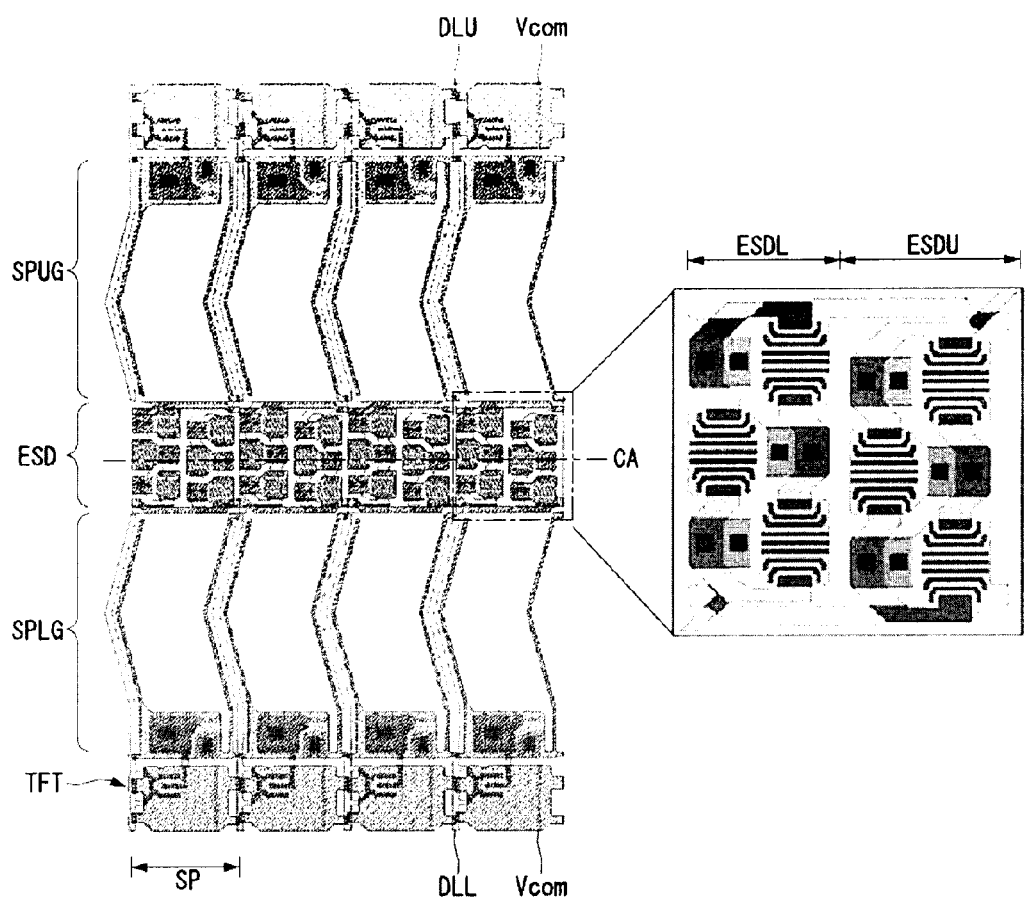
FIG. 5 is an enlarged view of the ESD circuit illustrated in FIG. 3.

FIG. 3 is a top plan view illustrating a configuration of a display panel according to a first exemplary embodiment of the present invention. FIG. 4 is an enlarged view of the central portion illustrated in FIG. 3 according to the first exemplary embodiment of the present invention. FIG. 5 is an enlarged view of the ESD circuit illustrated in FIG. 3.

As illustrated in FIG. 3, the upper data driver 140U is positioned in an upper part of the display panel 150, and the lower data driver 140L is positioned in a lower part of the display panel 150. The following description will be given with an example where the upper and lower data drivers 140U and 140L are electrically connected to the display panel 150 while mounted on a flexible circuit board. However, the present invention is not limited to this example, and one of ordinary skill in the art would understand that the upper and lower data drivers 140U and 140L may be mounted in a form of chip-on-glass (COG) on the display panel or in other forms known in the industry.

The upper and lower data drivers 140U and 140L are mounted on upper and lower flexible circuit boards 145U and 145L. The upper and lower flexible circuit boards 145U and 145L are attached to the upper and lower parts of the display panel 150 by an anisotropic conductive film or the like. The upper and lower data drivers 140U and 140L are electrically connected to the upper and lower data lines DLU and DLL of the display panel 150, respectively, by the upper and lower flexible circuit boards 145U and 145L attached to the display panel 150.

The upper and lower data lines DLU and DLL are designed to have a "data line output floating" structure where the upper and lower data lines DLU and DLL are electrically separated and float with respect to a display area AA or a central portion CA of the display panel 150. The upper and lower data lines DLU and DLL are divided and arranged in a vertical direction (y) so as to be located between the sub-pixels SP.

An electrostatic discharge circuit ESD (hereinafter, ESD circuit) is formed in the display area AA or the central portion CA of the display panel 150 which corresponds to a space between the upper and lower data lines DLU and DLL.

The ESD circuit ESD forms an electrostatic path at ends of the upper and lower data lines DLU and DLL (which correspond to the central portion) to discharge or electrostatically discharge electrostatic charge in the display panel. The ESD circuit ESD is arranged in a horizontal direction (x) at the ends of the upper and lower data lines DLU and DLL (which correspond to the central portion).

As the upper and lower data lines DLU and DLL are separated, the sub-pixels connected to the upper data lines DLU of the display panel 150 are defined as an upper sub-pixel group SPUG and the sub-pixels connected to the lower data lines DLL are defined as a lower sub-pixel group SPLG. That is, the sub-pixels positioned above the central portion CA of the display area AA are included in the upper sub pixel group SPUG and the supixels positioned below the central portion CA of the display area AA are included in the upper sub-pixel group SPLG.

As illustrated in FIG. 4, an opening area OPN and a transistor area TFTA are arranged in a mirror-like fashion in the central portion CA of the display area AA, for each of the upper sub-pixel group SPUG and the lower sub-pixel group SPLG.

In other words, either the sub-pixels included in the upper sub-pixel group SPUG or the sub-pixels included in the lower sub-pixel group SPLG are reversed to make the opening area OPN face the central portion CA of the display area AA. Either the sub-pixels included in the upper sub-pixel group SPUG or the sub-pixels included in the lower sub-pixel group SPLG are inverted like a mirror image. Accordingly, the thin film transistors TFTs of the sub-pixels SP, regardless of whether they belong to the upper sub-pixel group SPUG or the lower sub pixel group SPLG, are arranged side by side along one side (the left side in the drawing).

Common voltage lines Vcom for transmitting a common voltage to common electrodes are formed adjacent to the upper and lower data lines DLU and DLL. Unlike the upper and lower data lines DLU and DLL, the common voltage lines Vcom may be arranged vertically (y) and horizontally (x) in a grid-like pattern, but the present invention is not limited to this. The common voltage lines Vcom are vertically separated from each other, like the upper and lower data lines DLU and DLL, or electrically connected to each other.

Based on the drawings, the sub-pixels SP included in the upper sub-pixel group SPUG are oriented in a reverse direction such that the opening area OPN faces the central portion CA of the display area AA. Accordingly, as for the sub-pixels included in the upper sub-pixel group SPUG, the transistor area TFTA is positioned above the opening area OPN.

On the other hand, the sub-pixels SP included in the lower sub-pixel group SPLG are oriented in a forward direction such that the opening area OPN faces the central portion CA of the display area AA. Accordingly, as for the sub-pixels included in the lower sub-pixel group SPLG, the opening area OPN is positioned above the transistor area TFTA.

In the above description, the opening area OPN corresponds to a light emitting region, and the transistor area TFTA corresponds to a non-light-emitting region. Pixel electrodes and common electrodes are included in the opening area OPN, and thin film transistors TFT, etc are included in the transistor area TFTA.

Unlike the light emitting region, the non-light-emitting region may be an area blocked by a black matrix. Typically, the black matrix is formed on an inner or outer surface of the upper substrate of the liquid crystal display panel. The black matrix is a structure for reducing or preventing light leakage from the non-light-emitting region, and may be made of black pigment and resin. The black matrix is positioned between the sub-pixels SP in a vertical direction or in vertical and lateral directions.

As described above, if the sub-pixels SP are arranged in a mirror-like fashion with respect to the central portion CA of the display area AA, the ESD circuit ESD can be arranged to correspond to a black matrix forming region. Due to this, even if the ESD circuit ESD is arranged and formed in the central portion CA of the display area AA, the ESD circuit ESD is blocked by the black matrix. That is, with the above arrangement of the sub-pixels SP, the ESD circuit ESD can be easily formed despite the "data line output floating" structure where the upper and lower data lines DLU and DLL are electrically separated and float with respect to the central portion CA of the display panel 150.

As illustrated in FIG. 5, the ESD circuit ESD includes upper and lower ESD circuits ESDU and ESDL. The upper ESD circuit ESDU forms an electrostatic path for discharging electrostatic charge in the sub-pixels SP included in the upper sub-pixel group SPUG, and the lower ESD circuit ESDL forms an electrostatic path for discharging electrostatic charge in the sub-pixels SP included in the lower sub-pixel group SPLG.

Hereinafter, exemplary configurations and structures of the upper and lower ESD circuits ESDU and ESDL will be described in detail.

Figure 6:
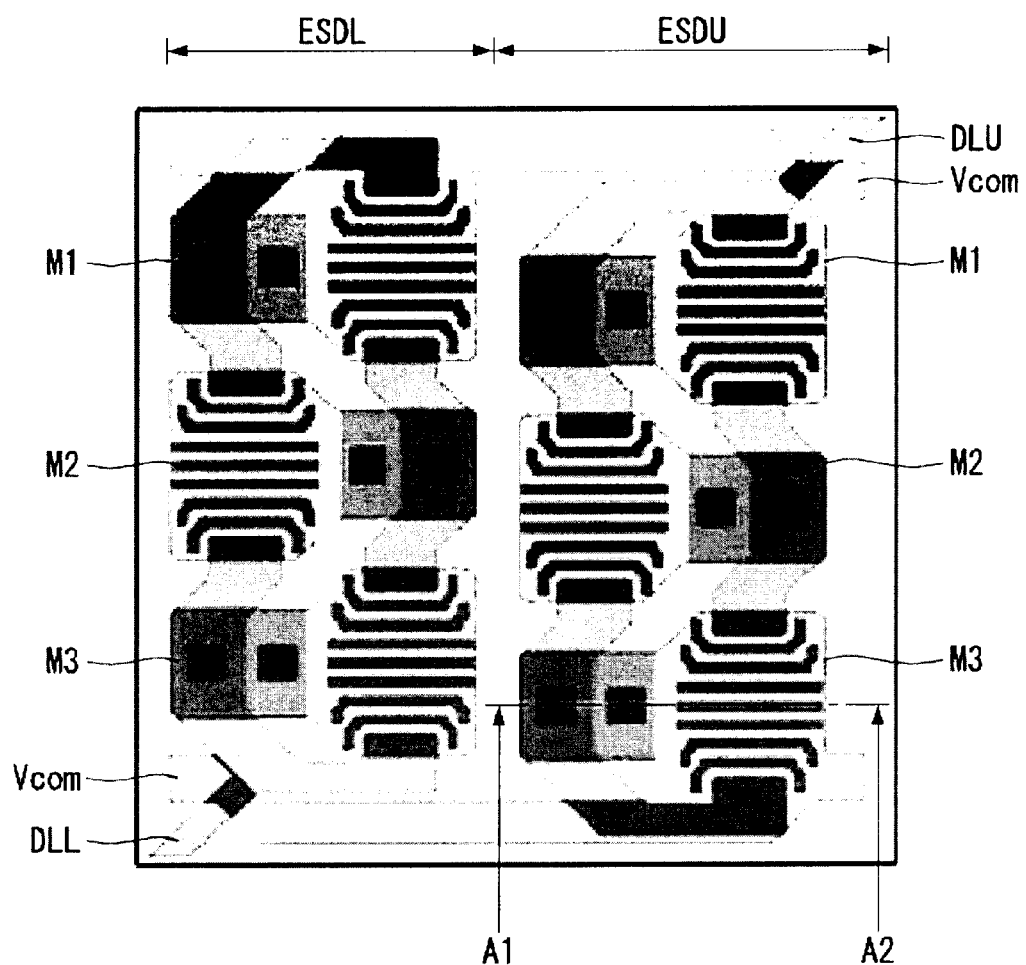
FIG. 6 is a top plane view illustrating upper and lower ESD circuits.
Figure 7:
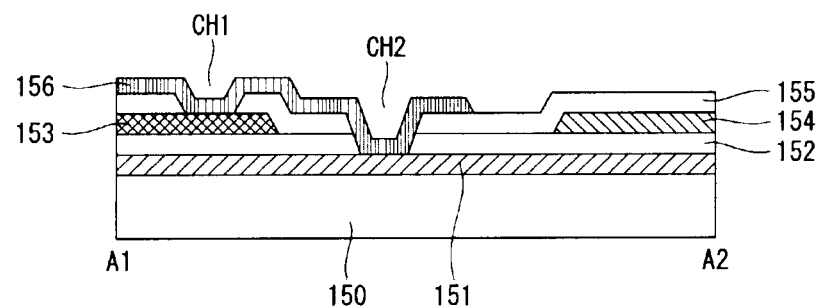
FIG. 7 is a cross-section view taken along line A1-A2 of FIG. 6.
Figure 8:
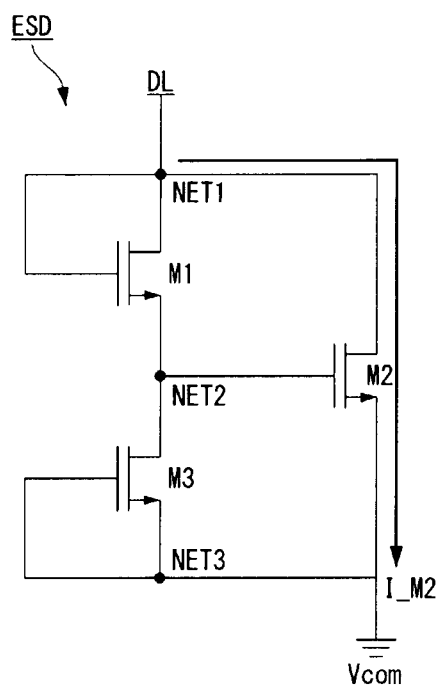
FIGS. 8 to 10 are views illustrating configurations of ESD circuits according to embodiments of the present invention.
Figure 9:
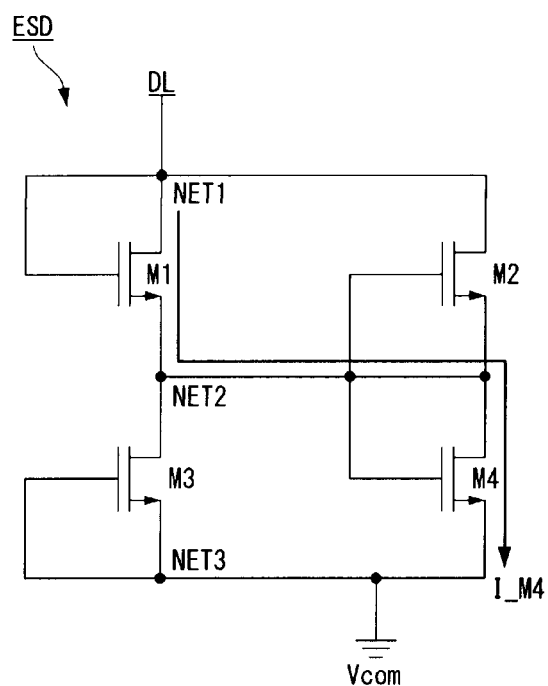
Figure 10:
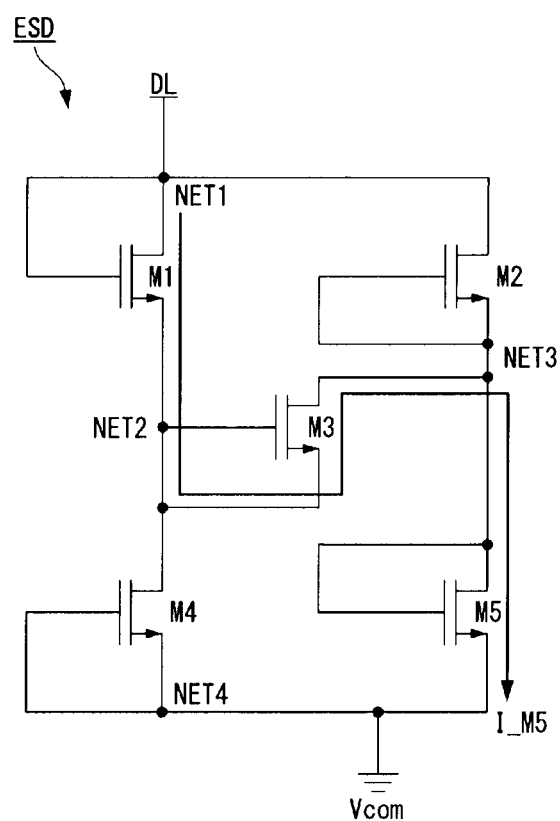

FIG. 6 is a top plane view illustrating upper and lower ESD circuits. FIG. 7 is a cross-section view taken along line A1-A2 of FIG. 6. FIGS. 8 to 10 are views illustrating configurations of ESD circuits according to embodiments of the present invention.

As illustrated in FIG. 6, the upper and lower ESD circuits ESDU and ESDL each include first to third transistors M1 to M3. The first to third transistors M1 to M3 of the upper and lower ESD circuits ESDU and ESDL are configured to have separate areas. The upper and lower ESD circuits ESDU and ESDL form an electrostatic path for discharging electrostatic charge in the sub-pixels SP through the common voltage lines Vcom connected to the first to third transistors M1 to M3.

The upper ESD circuit ESDU is electrically connected to the upper data lines DLU connected to the sub-pixels SP of the upper sub-pixel group SPUG and the common voltage lines Vcom. The upper ESD circuit ESDU releases or discharges the electric charges or static electricity formed in the upper data lines DLU through the common voltage lines Vcom. The lower ESD circuit ESDL is electrically connected to the lower data lines DLL connected to the sub-pixels SP of the lower sub-pixel group SPLG and the common voltage lines Vcom. The lower ESD circuit ESDL releases or discharges the electric charges or static electricity formed in the lower data lines DLL through the common voltage lines Vcom.

The first to third transistors M1 to M3 of the upper and lower ESD circuits ESD and ESDL may be formed by the same process as the thin film transistors of the sub-pixels SP. By way of example, this configuration will be described below with reference to a cross-section of the area where the second and third transistors M2 and M3 of the upper ESD circuit ESDU are electrically connected.

As illustrated in FIG. 7, a gate electrode 151 of the third transistor M3 is formed on a lower substrate 150 defined by the central portion of the display area. A first insulation film 152 is formed on the gate electrode 151 of the third transistor M3.

A first electrode 153, which serves as a source or drain electrode of the second transistor M2, is formed on one side (the left side in the drawing) of the first insulation film 152. A semiconductor layer 154 of the third transistor M3 is formed on the other side (the right side in the drawing) of the first insulation layer 151. A second insulation film 155 is formed on the first electrode 153 and semiconductor layer 154 of the third transistor M3.

A connecting electrode 156 is formed on the second insulation film 155. The connecting electrode 156 is an electrode that electrically connects the first electrode 153 of the second transistor M2 and the gate electrode 151 of the third transistor M3. The connecting electrode 156 electrically connects the first electrode 153 and the gate electrode 151 of the third transistor M3 via a first contact hole CH1 passing through the second insulation film 155 and a second contact hole CH2 passing through the first and second insulation films 152 and 155. The first to third transistors M1 to M3 of the upper and lower ESD circuits ESDU and ESDL are also formed by the same process as the thin film transistors of the sub-pixels SP.

As described above, the ESD circuit ESD is configured with three transistors. However, the ESD circuit ESD may be configured with four, five, or M transistors (M is an integer greater than five). For explanation purposes, an ESD circuit ESD configured with three transistors will be described below.

As illustrated in FIG. 8, an ESD circuit ESD may be configured with first to third transistors M1 to M3. The gate electrode and first electrode of the first transistor M1 are commonly connected to a first node NET1 connected to a data line DL, and the second electrode of the first transistor M1 is connected to a second node NET2 connected to the gate electrode of the second transistor M2 and the first electrode of the third transistor M3. The first electrode of the second transistor M2 is connected to the first node NET1, the gate electrode of the second transistor M2 is connected to the second node NET2, and the second electrode of the second transistor M2 is connoted to a third node NET3 connected to a common voltage line Vcom. The first electrode of the third transistor M3 is connected to the second node NET2, and the gate electrode and second electrode of the third transistor M3 are commonly connected to the third node NET3.

In the ESD circuit ESD configured with three transistors, static electricity coming through the data line DL passes through the path "I_M2" by the turned-on second transistor M2 and is discharged through the common voltage line Vcom.

As illustrated in FIG. 9, an ESD circuit ESD may be configured with first to fourth transistors M1 to M4. The gate electrode and first electrode of the first transistor M1 are commonly connected to a first node NET1 connected to a data line DL, and the second electrode of the first transistor M1 is connected to a second node NET2 connected to the gate electrodes of the second and fourth transistors M2 and M4 and the first electrode of the third transistor M3. The first electrode of the second transistor M2 is connected to the first node NET1, and the gate electrode and second electrode of the second transistor M2 are commonly connected to the second node NET2. The first electrode of the second transistor M2 is connected to the first node NET1, and the gate electrode and second electrode of the second transistor M2 are commonly connected to the second node NET2. The first electrode of the third transistor M3 is connected to the second node NET2, and the gate electrode and second electrode of the third transistor M3 are commonly connected to a third node NET3 connected to a common voltage line Vcom. The gate electrode and first electrode of the fourth transistor M4 are commonly connected to the second node NET2, and the second electrode of the fourth transistor M4 is connected to the third node NET3.

In the ESD circuit ESD configured with four transistors, static electricity coming through the data line DL passes through the path "I_M4" by the turned-on first and fourth transistors M1 and M4 and is discharged through the common voltage line Vcom.

As illustrated in FIG. 10, an ESD circuit ESD may be configure with first to fifth transistors M1 to M5. The gate electrode and first electrode of the first transistor M1 are commonly connected to a first node NET1 connected to a data line DL, and the second electrode of the first transistor M1 is connected to a second node NET2 connected to the gate electrode of the third transistor M3 and the first electrode of the fourth transistor M4. The first electrode of the second transistor M2 is connected to the first node NET1, and the gate electrode and second electrode of the second transistor M2 are commonly connected to a third node NET3. The gate electrode of the third transistor M3 is connected to the second node NET2, and the first and second electrodes of the third transistor M3 are connected to the third node NET3 and the second node NET2, respectively. The first electrode of the fourth transistor M4 is connected to the second node NET2, and the gate electrode and second electrode of the fourth transistor M4 are commonly connected to a fourth node NET4 connected to a common voltage line Vcom. The gate electrode and first electrode of the fifth transistor M5 are commonly connected to the third node NET3, and the second electrode of the fifth transistor M5 is connected to the fourth node NET4 connected to the common voltage line Vcom.

In the ESD circuit ESD configured with five transistors, static electricity coming through the data line DL passes through the path "I_M5" by the turned-on first, third, and fifth transistors M1, M3, and M5 and is discharged through the common voltage line Vcom.

Hereinafter, a modification of the first exemplary embodiment of the present invention will be described.

Figure 11A:
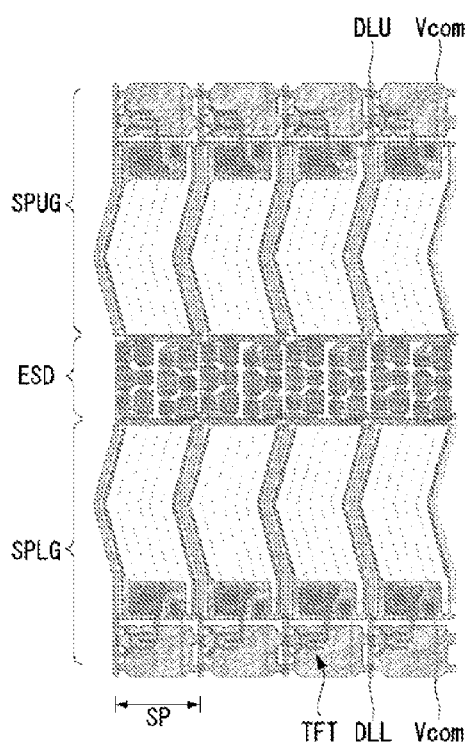
FIGS. 11(a) and 11(b) are views illustrating the first embodiment of the present invention and a modification of the same.
Figure 11B:
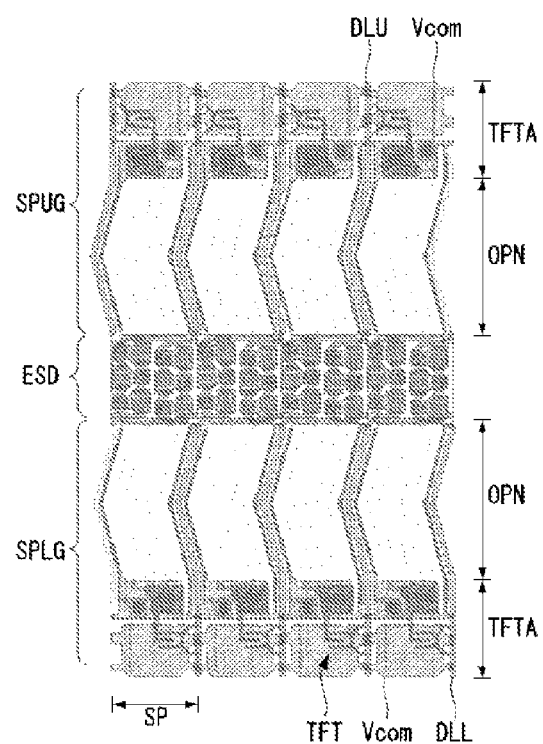

FIGS. 11(a) and 11(b) are views illustrating the first embodiment of the present invention and a modification of the same.

FIG. 11(a) illustrates a structure according to the first exemplary embodiment of the present invention. As illustrate in FIG. 11(a), an opening area OPN and a transistor area TFTA are arranged in a mirror-like fashion with respect to the central portion CA of the display area AA, for each of the upper sub-pixel group SPUG and the lower sub-pixel group SPLG.

FIG. 11(b) illustrates a structure according to a modification of the first exemplary embodiment of the present invention. As illustrated in FIG. 11(b), the opening area OPN is arranged in a mirror-like fashion with respect to the central portion CA of the display area AA, for each of the upper sub-pixel group SPUG and the lower sub-pixel group SPLG. However, the transistor area TFTA does not necessarily need to be arranged in a mirror-like fashion.

Referring to FIG. 11(b), the sub-pixels SP included in the upper sub-pixel group SPUG are oriented in a reverse direction such that the opening area OPN faces the central portion CA of the display area AA. Accordingly, for the sub-pixels included in the upper sub-pixel group SPUG, the transistor area TFTA is positioned above the opening area OPN.

On the other hand, the sub-pixels SP included in the lower sub-pixel group SPLG are oriented in a forward direction such that the opening area OPN faces the central portion CA of the display area AA. Accordingly, for the sub-pixels included in the lower sub-pixel group SPLG, the opening area OPN is positioned above the transistor area TFTA.

The thin film transistors TFT included in the sub-pixels SP of the upper sub-pixel group SPUG are arranged adjacent to one side (the left side in the drawing), whereas the thin film transistors TFT included in the sub pixels SP of the lower sub-pixel group SPLG are arranged adjacent to the other side (the right right in the drawing). That is, the thin film transistors TFT included in the sub-pixels SP of the upper sub-pixel group SPUG and the thin film transistors TFT included in the sub pixels SP of the lower sub-pixel group SPLG have different orientations. Accordingly, the upper data lines DLU and common voltage lines Vcom adjacent to them and the lower data lines DLL and common voltage lines Vcom adjacent to them have different orientations.

The sub-pixels of the upper and lower sub-pixel groups SPUG and SPLG can be divided into two parts: upper and lower, with respect to the central portion of the display area, and arranged in different structures. However, these structures are merely examples, and the arrangement of sub-pixels not adjacent to the central portion may be modified in various forms, so long as the ESD circuit ESD is substantially blocked by the black matrix in the central portion of the display area.

Second Exemplary Embodiment

Figure 12:
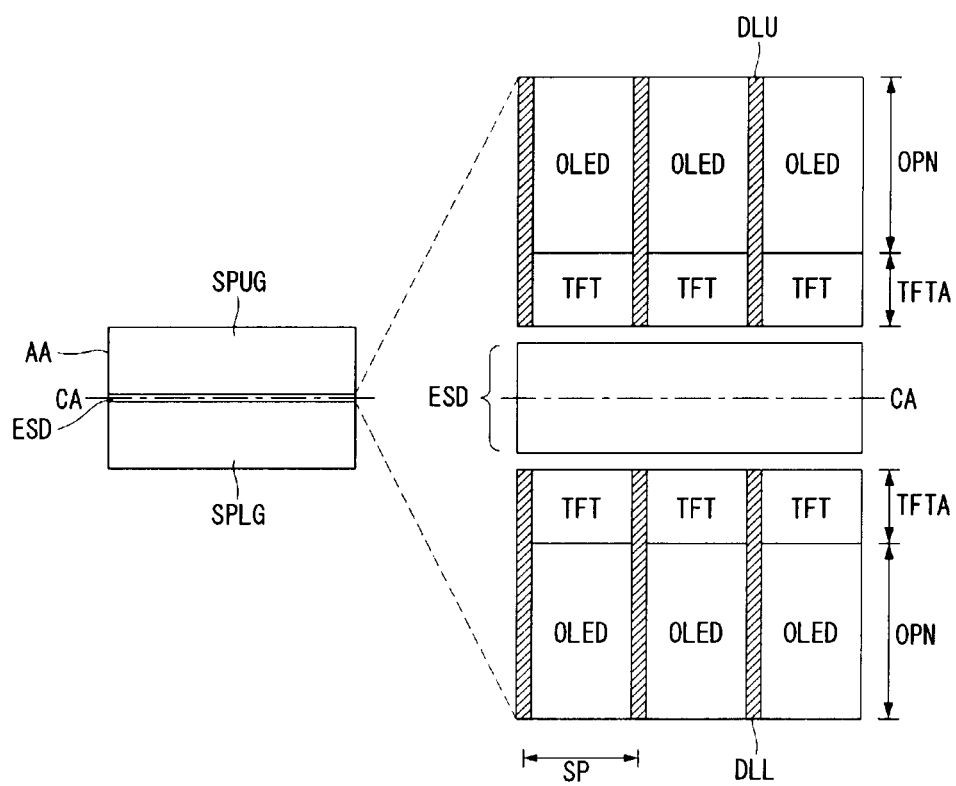
FIG. 12 is an enlarged view of the central portion illustrated in FIG. 3 according to a second exemplary embodiment of the present invention.
Figure 13:
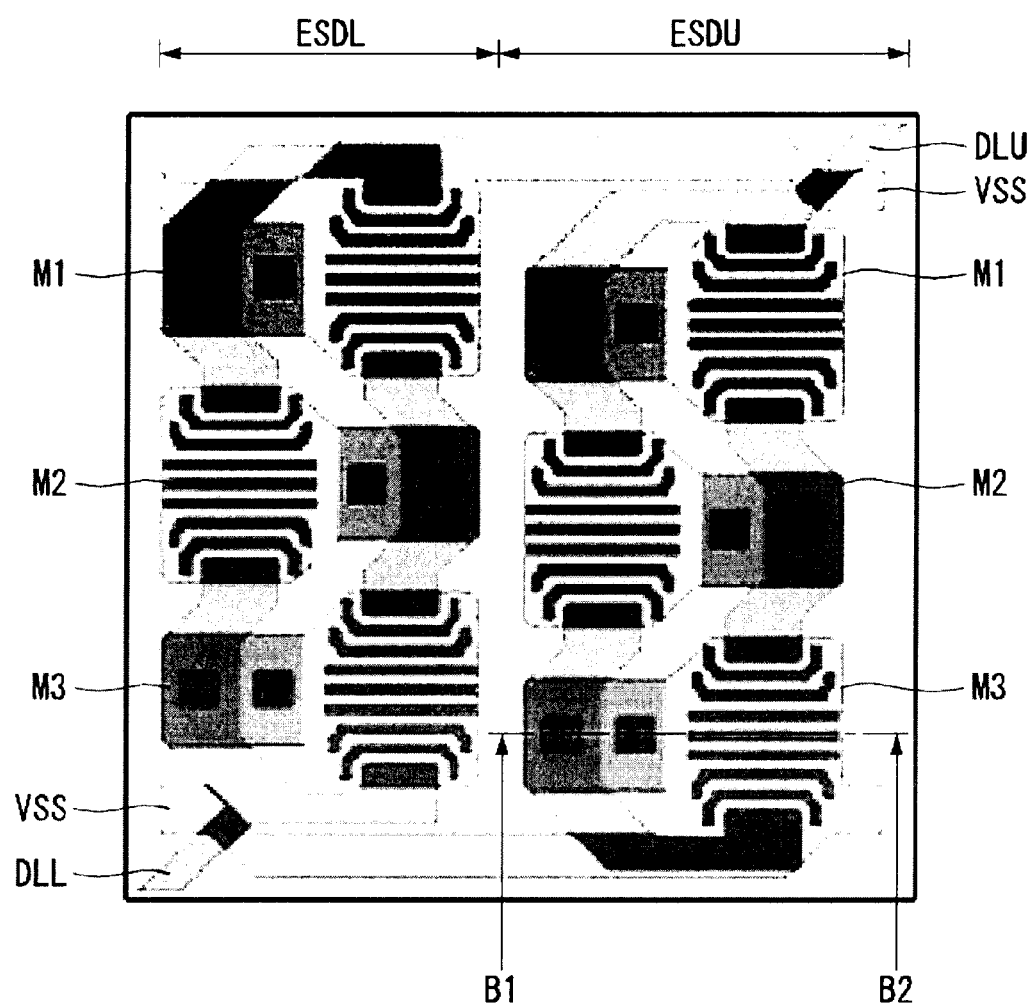
FIG. 13 is an enlarged view of the ESD circuit illustrated in FIG. 12.
Figure 14:
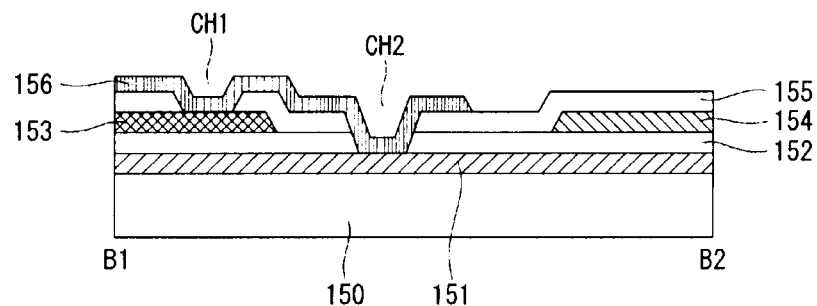
FIG. 14 is a cross-sectional view taken along line B1-B2 of FIG. 13.

FIG. 12 is an enlarged view of the central portion illustrated in FIG. 3 according to a second exemplary embodiment of the present invention. FIG. 13 is an enlarged view of an ESD circuit illustrated in FIG. 12. FIG. 14 is a cross-sectional view taken along line B1-B2 of FIG. 13.

As described with reference to FIG. 3 in the first exemplary embodiment, the upper and lower data lines DLU and DLL of the second exemplary embodiment of the present invention are also designed to have a "data line output floating" structure where the upper and lower data lines DLU and DLL are electrically separated and float with respect to the central portion CA of the display panel 150. The upper and lower data lines DLU and DLL are divided and arranged in a vertical direction (y) so as to be located between the sub-pixels SP.

An electrostatic discharge circuit ESD (hereinafter, ESD circuit) is formed in the central portion CA of the display panel 150 which corresponds to the space between the upper and lower data lines DLU and DLL. The ESD circuit ESD forms an electrostatic path for discharging electrostatic charge at ends of the upper and lower data lines DLU and DLL (which correspond to the central portion) in the display panel. The ESD circuit ESD is arranged in a horizontal direction (x) at the ends of the upper and lower data lines DLU and DLL (which correspond to the central portion).

As the upper and lower data lines DLU and DLL are separated, the sub-pixels connected to the upper data lines DLU of the display panel 150 are defined as an upper sub-pixel group SPUG and the sub-pixels connected to the lower data lines DLL are defined as a lower sub-pixel group SPLG.

Hereinafter, the second exemplary embodiment of the present invention will be described in detail. In this embodiment, an organic light emitting display panel is used as the display panel 150 by way of example.

As illustrated in FIG. 12, an opening area OPN and a transistor area TFTA are arranged in a mirror-like fashion with respect to the central portion CA of the display area AA, for each of the upper sub-pixel group SPUG and the lower sub-pixel group SPLG.

In other words, either the sub-pixels included in the upper sub-pixel group SPUG or the sub-pixels included in the lower sub-pixel group SPLG are reversed to make the opening area OPN face the central portion CA of the display area AA. Either the sub-pixels included in the upper sub-pixel group SPUG or the sub-pixels included in the lower sub-pixel group SPLG are inverted like a mirror image.

Referring to FIG. 12, the sub-pixels SP included in the upper sub-pixel group SPUG are oriented in a forward direction so that the opening area OPN faces the central portion CA of the display area AA. Accordingly, as for the sub-pixels included in the upper sub-pixel group SPUG, the opening area OPN is positioned above the transistor area TFTA.

On the other hand, the sub-pixels SP included in the lower sub-pixel group SPLG are oriented in a reverse direction so that the opening area OPN faces the central portion CA of the display area AA. Accordingly, as for the sub-pixels included in the lower sub-pixel group SPLG, the transistor area TFTA is positioned above the opening area OPN.

In the above description, the opening area OPN corresponds to a light emitting region, and the transistor area TFTA corresponds to a non-light-emitting region. Organic light emitting diodes OLED, each including an anode, an organic emission layer and a cathode, are included in the opening area OPN, and thin film transistors TFT, etc are included in the transistor area TFTA.

Unlike the light-emitting region, the non-light-emitting region is a region that emits substantially no light. Typically, an organic light emitting display panel uses light emitted from the organic light emitting diodes OLED of the opening area OPN, rather than using light emitted from backlight units as in a liquid crystal display panel. Thus, the organic light emitting display panel does not need a structure like a black matrix that blocks the non-light-emitting region. Nevertheless, the organic light emitting display panel may be designed such that the transistor area TFTA corresponding to the non-light-emitting region is not increased.

As described above, if the sub-pixels SP are arranged in a mirror-like fashion with respect to the central portion CA of the display area AA, the ESD circuit ESD can be arranged and formed in the central portion CA of the display area AA while preventing an increase of the transistor area TFTA corresponding to the non-light-emitting region. That is, with the above arrangement of the sub-pixels SP, the ESD circuit ESD can be easily formed despite the "data line output floating" structure where the upper and lower data lines DLU and DLL are electrically separated and float in the central portion CA of the display panel 150.

The sub-pixels of the upper and lower sub-pixel groups SPUG and SPLG can be divided into two parts: upper and lower, in the central portion of the display area, and arranged in different structures. However, these structures are merely examples, and the arrangement of sub-pixels may be modified in various forms, so long as the ESD circuit ESD can be arranged while preventing an increase of the transistor area TFTA corresponding to the non-light-emitting region.

As illustrated in FIG. 13, the ESD circuit ESD includes upper and lower ESD circuits ESDU and ESDL. The upper ESD circuit ESDU forms an electrostatic path for discharging electrostatic charge in the sub-pixels SP included in the upper sub-pixel group SPUG, and the lower ESD circuit ESDL forms an electrostatic path for discharging electrostatic charge in the sub-pixels SP included in the lower sub-pixel group SPLG.

The upper and lower ESD circuits ESDU and ESDL each include first to third transistors M1 to M3. The first to third transistors M1 to M3 of the upper and lower ESD circuits ESDU and ESDL are configured to have separate areas. The upper and lower ESD circuits ESDU and ESDL form an electrostatic path for discharging electrostatic charge in the sub-pixels SP through the common voltage lines Vcom connected to the first to third transistors M1 to M3.

The upper ESD circuit ESDU is electrically connected to the upper data lines DLU connected to the sub-pixels SP of the upper sub-pixel group SPUG and the common voltage lines Vcom. The upper ESD circuit ESDU releases or discharges the electric charges or static electricity formed in the upper data lines DLU through the common voltage lines Vcom. The lower ESD circuit ESDL is electrically connected to the lower data lines DLL connected to the sub-pixels SP of the lower sub-pixel group SPLG and the common voltage lines Vcom. The lower ESD circuit ESDL releases or discharges the electric charges or static electricity formed in the lower data lines DLL through the common voltage lines Vcom.

The first to third transistors M1 to M3 of the upper and lower ESD circuits ESD and ESDL may be formed by the same process as the thin film transistors of the sub-pixels SP. By way of example, this configuration will be described below with reference to a cross-section of the area where the second and third transistors M2 and M3 of the upper ESD circuit ESDU are electrically connected.

As illustrated in FIG. 14, a gate electrode 151 of the third transistor M3 is formed on a lower substrate 150 defined by the central portion of the display area. A first insulation film 152 is formed on the gate electrode 151 of the third transistor M3.

A first electrode 153, which serves as a source or drain electrode of the second transistor M2, is formed on one side (the left side in the drawing) of the first insulation film 152. A semiconductor layer 154 of the third transistor M3 is formed on the other side (the right side in the drawing) of the first insulation layer 151. A second insulation film 155 is formed on the first electrode 153 and semiconductor layer 154 of the third transistor M3.

A connecting electrode 156 is formed on the second insulation film 155. The connecting electrode 156 is an electrode that electrically connects the first electrode 153 of the second transistor M2 and the gate electrode 151 of the third transistor M3. The connecting electrode 156 electrically connects the first electrode 153 and the gate electrode 151 of the third transistor Me via a first contact hole CH1 passing through the second insulation film 155 and a second contact hole CH2 passing through the first and second insulation films 152 and 155. The first to third transistors M1 to M3 of the upper and lower ESD circuits ESDU and ESDL are also formed by the same process as the thin film transistors of the sub-pixels SP.

As described above, the ESD circuit ESD is configured with three transistors. However, the ESD circuit ESD may be configured with four, five, or M transistors (M is an integer greater than five). For explanation purposes, an ESD circuit ESD configured with three transistors will be described below.

Figure 15:
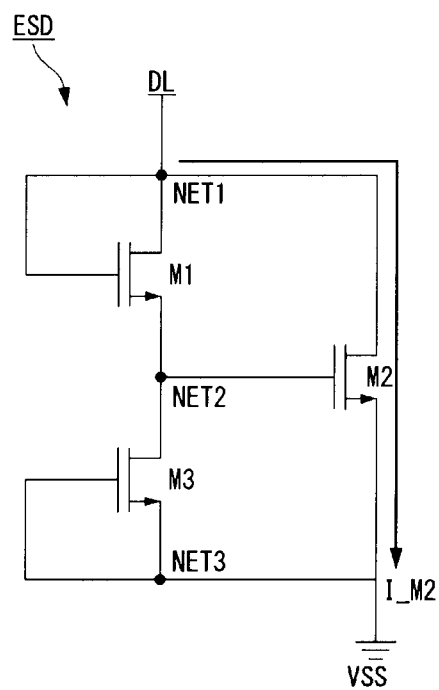
FIGS. 15 to 17 are views illustrating configurations of ESD circuits according to embodiments of the present invention.
Figure 16:
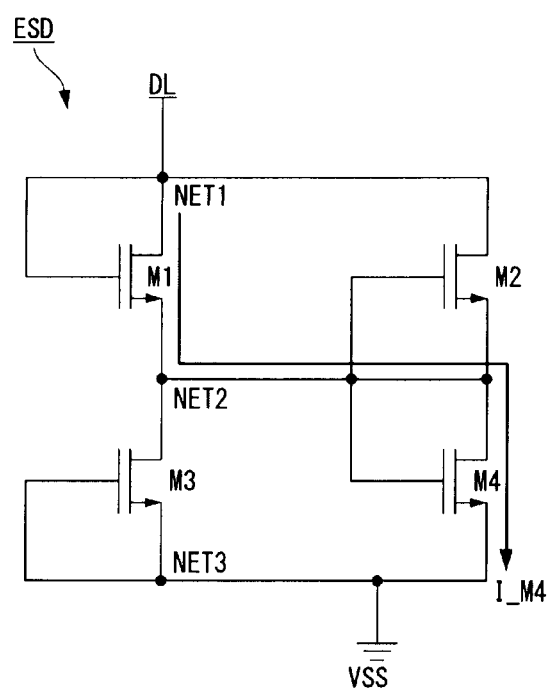
Figure 17:
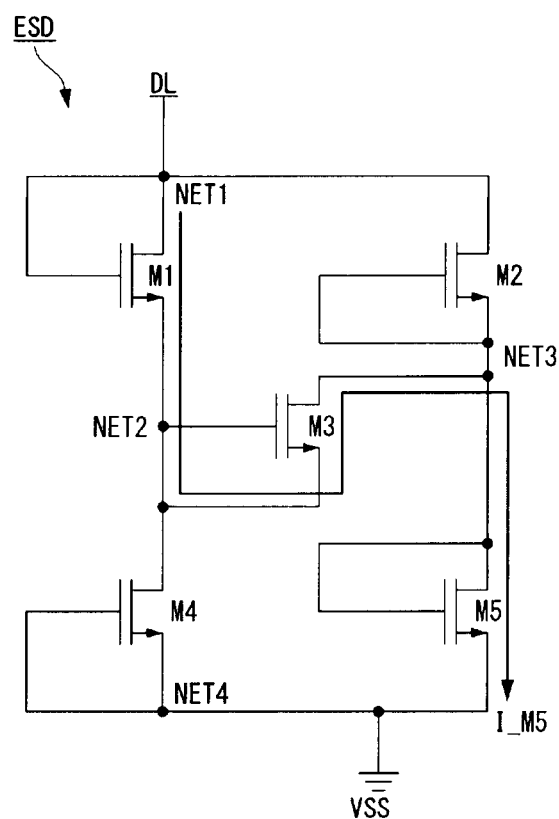

FIGS. 15 to 17 are views illustrating configurations of ESD circuits according to embodiments of the present invention.

As illustrated in FIG. 15, an ESD circuit ESD may be configured with first to third transistors M1 to M3. The gate electrode and first electrode of the first transistor M1 are commonly connected to a first node NET1 connected to a data line DL, and the second electrode of the first transistor M1 is connected to a second node NET2 connected to the gate electrode of the second transistor M2 and the first electrode of the third transistor M3. The first electrode of the second transistor M2 is connected to the first node NET1, the gate electrode of the second transistor M2 is connected to the second node NET2, and the second electrode of the second transistor M2 is connoted to a third node NET3 connected to a ground line VSS. The first electrode of the third transistor M3 is connected to the second node NET2, and the gate electrode and second electrode of the third transistor M3 are commonly connected to the third node NET3.

In the ESD circuit ESD configured with three transistors, static electricity coming through the data line DL passes through the path "I_M2" by the turned-on second transistor M2 and is discharged through the ground line VSS.

As illustrated in FIG. 16, an ESD circuit ESD may be configured with first to fourth transistors M1 to M4. The gate electrode and first electrode of the first transistor M1 are commonly connected to a first node NET1 connected to a data line DL, and the second electrode of the first transistor M1 is connected to a second node NET2 connected to the gate electrodes of the second and fourth transistors M2 and M4 and the first electrode of the third transistor M3. The first electrode of the second transistor M2 is connected to the first node NET1, and the gate electrode and second electrode of the second transistor M2 are commonly connected to the second node NET2. The first electrode of the second transistor M2 is connected to the first node NET1, and the gate electrode and second electrode of the second transistor M2 are commonly connected to the second node NET2. The first electrode of the third transistor M3 is connected to the second node NET2, and the gate electrode and second electrode of the third transistor M3 are commonly connected to a third node NET3 connected to a ground line VSS. The gate electrode and first electrode of the fourth transistor M4 are commonly connected to the second node NET2, and the second electrode of the fourth transistor M4 is connected to the third node NET3.

In the ESD circuit ESD configured with four transistors, static electricity coming through the data line DL passes through the path "I_M4" by the turned-on first and fourth transistors M1 and M4 and is discharged through the ground line VSS.

As illustrated in FIG. 17, an ESD circuit ESD may be configured with first to fifth transistors M1 to M5. The gate electrode and first electrode of the first transistor M1 are commonly connected to a first node NET1 connected to a data line DL, and the second electrode of the first transistor M1 is connected to a second node NET2 connected to the gate electrode of the third transistor M3 and the first electrode of the fourth transistor M4. The first electrode of the second transistor M2 is connected to the first node NET 1, and the gate electrode and second electrode of the second transistor M2 are commonly connected to a third node NET3. The gate electrode of the third transistor M3 is connected to the second node NET2, and the first and second electrodes of the third transistor M3 are connected to the third node NET3 and the second node NET2, respectively. The first electrode of the fourth transistor M4 is connected to the second node NET2, and the gate electrode and second electrode of the fourth transistor M4 are commonly connected to a fourth node NET4 connected to a ground line VSS. The gate electrode and first electrode of the fifth transistor M5 are commonly connected to the third node NET3, and the second electrode of the fifth transistor M5 is connected to the fourth node NET4 connected to the ground line VSS.

In the ESD circuit ESD configured with five transistors, static electricity coming through the data line DL passes through the path "I_M5" by the turned-on first, third, and fifth transistors M1, M3, and M5 and is discharged through the ground line VSS.

The present invention has been described so far by taking as examples a liquid crystal display panel and an organic light emitting display panel which are designed to have a "data line output floating" structure where upper and lower data lines are electrically separated and float in a central portion of the display panel. However, the present invention is not limited to these examples, but is applicable to various types of display panels including an electrophoresis display panel. While the first and second exemplary embodiments of the present invention have been described using a common voltage line and a ground line, respectively, for discharging static electricity or the like, they can be designed such that static electricity or the like is discharged through other lines.

A display panel according to an embodiment of the present invention has an advantage of being less sensitive to static electricity by inserting an ESD circuit in a central portion of the display panel with a vertically separated structure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
    a display panel;
    sub-pixels in a display area of the display panel;
    upper and lower data lines separated in a central portion of the display area; and
    an electrostatic discharge circuit formed in the central portion of the display area, the electrostatic discharge circuit electrically connected to the upper and lower data lines,
    wherein the sub-pixels comprise an upper sub-pixel group above the central portion of the display area and connected to the upper data lines and a lower sub-pixel group below the central portion of the display area and connected to the lower data lines.

2. The display device of claim 1, wherein the upper sub-pixel group and the lower sub-pixel group are arranged in a mirror-like fashion in the central portion of the display area.

3. The display device of claim 1, wherein the display panel is a liquid crystal display panel, and the sub-pixels of the upper and lower sub-pixel groups are arranged such that a light-emitting opening area faces the central portion of the display area.

4. The display device of claim 3, wherein thin film transistors of the sub-pixels included in the upper and lower sub-pixel groups are arranged side by side along one side.

5. The display device of claim 3, wherein thin film transistors of the sub-pixels included in the upper sub-pixel group are arranged side by side along one side, and thin film transistors of the sub-pixels included in the lower sub-pixel group are arranged side by side along the other side.

6. The display device of claim 3, wherein the electrostatic discharge circuit comprises:
    an upper electrostatic discharge circuit connected between ends of the upper data lines and a common voltage line; and
    a lower electrostatic discharge circuit connected between ends of the lower data lines and the common voltage line.

7. The display device of claim 3, wherein the electrostatic discharge circuit is blocked by a black matrix that is used to reduce or prevent light leakage from the liquid crystal display panel.

8. The display device of claim 1, wherein the display panel is an organic light emitting display panel, and the sub-pixels of the upper and lower sub-pixel groups are arranged such that a light-emitting opening area faces the central portion of the display area.

9. The display device of claim 8, wherein the electrostatic discharge circuit comprises:
    an upper electrostatic discharge circuit connected between ends of the upper data lines and a common voltage line; and
    a lower electrostatic discharge circuit connected between ends of the lower data lines and the common voltage line.

* * * * *